US012811598B2

(12) United States Patent
Imai

(10) Patent No.: US 12,811,598 B2
(45) Date of Patent: Nov. 24, 2026

(54) SEMICONDUCTOR INTEGRATED CIRCUIT DEVICE

(71) Applicant: ROHM CO., LTD., Kyoto (JP)

(72) Inventor: Takeharu Imai, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 410 days.

(21) Appl. No.: 18/487,248

(22) Filed: Oct. 16, 2023

(65) Prior Publication Data

US 2024/0138159 A1 Apr. 25, 2024
US 2024/0237366 A9 Jul. 11, 2024

(30) Foreign Application Priority Data

Oct. 24, 2022 (JP) ................................ 2022-169721

(51) Int. Cl.
*H03M 1/36* (2006.01)

(52) U.S. Cl.
CPC .................................. *H03M 1/365* (2013.01)

(58) Field of Classification Search
CPC ................ H03M 1/365; G06F 13/4068; G06F 2213/0016; G06F 2213/0052; G06F 13/4282; G11C 29/028; G11C 29/50008; G11C 2029/0407
See application file for complete search history.

(56) References Cited

U.S. PATENT DOCUMENTS 4,644,322 A * 2/1987 Fujita .................. H03M 1/1071 341/96
4,768,018 A * 8/1988 Noujaim .............. H02H 1/0007 341/166
4,918,450 A * 4/1990 Sugiyama ........... H03M 1/1295 341/158
4,918,453 A * 4/1990 Kimura ..................... G06J 1/00 341/160
5,184,120 A * 2/1993 Schultz ................... G06F 3/023 708/145
5,218,362 A * 6/1993 Mayes ................ H03M 1/1047 341/120
6,963,298 B2 * 11/2005 Otsuka ................. H03M 1/363 341/155

(Continued)

FOREIGN PATENT DOCUMENTS

JP 2005-175326 6/2005
JP 2012-175287 A 9/2012

OTHER PUBLICATIONS

JP OA—Japanese Patent Office, Office Action in Japanese Appln. No. 2022-169721, dated Aug. 18, 2026, 8 pages (with English Translation).

*Primary Examiner* — Lam T Mai
(74) *Attorney, Agent, or Firm* — Fish & Richardson P.C.

(57) ABSTRACT

A semiconductor integrated circuit device includes: a terminal; an internal resistor that is any one of a pull-up resistor configured so that a first end of the pull-up resistor is connected to the terminal and a first constant voltage is applied to a second end of the pull-up resistor, or a pull-down resistor configured so that a first end of the pull-down resistor is connected to the terminal and a ground voltage is applied to a second end of the pull-down resistor; and an AD converter configured so that a voltage of the terminal is converted into digital data having a number of bits of 2 or more.

11 Claims, 11 Drawing Sheets

(56) References Cited

U.S. PATENT DOCUMENTS

| | | | | |
|---|---|---|---|---|
| 2003/0080891 | A1* | 5/2003 | Nagano | H04L 25/0272 341/155 |
| 2007/0153590 | A1* | 7/2007 | Seo | G11C 5/147 365/189.09 |
| 2007/0285294 | A1* | 12/2007 | Kim | G11C 5/143 341/154 |
| 2009/0000375 | A1* | 1/2009 | Johnson | G01F 23/363 73/317 |
| 2009/0195257 | A1* | 8/2009 | Hasenberg | G01D 3/08 324/555 |
| 2011/0048106 | A1* | 3/2011 | Zawacki | F02D 41/1494 73/28.01 |
| 2011/0304378 | A1 | 12/2011 | Sawyers | |
| 2012/0212362 | A1* | 8/2012 | Ebata | H03M 1/1076 341/155 |
| 2021/0376839 | A1* | 12/2021 | Vergauwen | H03L 7/099 |
| 2023/0179217 | A1* | 6/2023 | Wilson | G01R 31/3828 341/120 |
| 2023/0366748 | A1* | 11/2023 | Furukawa | G01K 7/24 |
| 2023/0421164 | A1* | 12/2023 | Jansson | H03M 1/168 |
| 2024/0044724 | A1* | 2/2024 | Bach | G01K 1/20 |
| 2024/0136988 | A1* | 4/2024 | Matsunami | H03F 3/45475 |

* cited by examiner

FIG. 6

| Resistance value of pull-down resistor R2 | Output of comparator COMP1 | Output of comparator COMP2 | Output of comparator COMP3 | Output of comparator COMP4 | Output of comparator COMP5 | Output of comparator COMP6 | Output of comparator COMP7 | Output of comparator COMP8 | Output of comparator COMP9 | Digital data D1 (address) |
|---|---|---|---|---|---|---|---|---|---|---|
| 1000Ω | LOW | HIGH | HIGH | HIGH | HIGH | HIGH | HIGH | HIGH | HIGH | 000 |
| 15400Ω | LOW | LOW | HIGH | HIGH | HIGH | HIGH | HIGH | HIGH | HIGH | 001 |
| 23200Ω | LOW | LOW | LOW | HIGH | HIGH | HIGH | HIGH | HIGH | HIGH | 010 |
| 35700Ω | LOW | LOW | LOW | LOW | HIGH | HIGH | HIGH | HIGH | HIGH | 011 |
| 54900Ω | LOW | LOW | LOW | LOW | LOW | HIGH | HIGH | HIGH | HIGH | 100 |
| 84500Ω | LOW | LOW | LOW | LOW | LOW | LOW | HIGH | HIGH | HIGH | 101 |
| 127000Ω | LOW | LOW | LOW | LOW | LOW | LOW | LOW | HIGH | HIGH | 110 |
| 196000Ω | LOW | LOW | LOW | LOW | LOW | LOW | LOW | LOW | HIGH | 111 |

SEMICONDUCTOR INTEGRATED CIRCUIT DEVICE

CROSS-REFERENCE TO RELATED APPLICATION

This application is based upon and claims the benefit of priority from Japanese Patent Application No. 2022-169721, filed on Oct. 24, 2022, the entire contents of which are incorporated herein by reference.

TECHNICAL FIELD

The present disclosure relates to a semiconductor integrated circuit device.

BACKGROUND

In the related art, there is, for example, a memory system shown in FIG. 1. The conventional memory system shown in FIG. 1 includes a microcomputer 101 and EEPROMs (Electrically Erasable and Programmable Read Only Memories) 102_1 and 102_2 which are semiconductor integrated circuit devices. The microcomputer 101, which is a master device, and the EEPROMs 102_1 and 102_2, which are slave devices, are interconnected by an I2C bus. Further, a maximum of eight EEPROMs 102_1 to 102_8 (EEPROMs 102_3 to 102_8 are not shown) can be connected to the microcomputer 101 by the I2C bus. In the following description, the EEPROMs 102_1 to 102_8 may be referred to as an EEPROM 102 when there is no need to distinguish them.

The EEPROM 102 recognizes its own address based on a level (HIGH level or LOW level) of a voltage applied to its own address terminals T_A0 to T_A2. In addition to the address terminals T_A0 to T_A2, the EEPROM 102 includes terminals T_SCL and T_SDA for I2C communication, and terminals T_Vcc, T_GND, and T_WP. The microcomputer 101 includes terminals T_SCL and T_SDA for I2C communication.

The EEPROM 102_1 recognizes its own address as 000 since a LOW level voltage is applied to its own address terminal T_A2, a LOW level voltage is applied to its own address terminal T_A1, and a LOW level voltage is applied to its own address terminal T_A0.

The EEPROM 102_2 recognizes its own address as 001 since a LOW level voltage is applied to its own address terminal T_A2, a LOW level voltage is applied to its own address terminal T_A1, and a HIGH level voltage is applied to its own address terminal T_A0.

The EEPROM 102 whose address matches 3-bit digital data in a slave address included in communication data output from the microcomputer 101 communicates with the microcomputer 101. In other words, the microcomputer 101 can select the EEPROM 102 communicating with the microcomputer 101, based on the 3-bit digital data in the slave address.

BRIEF DESCRIPTION OF DRAWINGS

The accompanying drawings, which are incorporated in and constitute a part of the specification, illustrate embodiments of the present disclosure.

FIG. 6 is a diagram showing a relationship between a resistance value of a pull-down resistor and an address.

DETAILED DESCRIPTION

Reference will now be made in detail to various embodiments, examples of which are illustrated in the accompanying drawings. In the following detailed description, numerous specific details are set forth in order to provide a thorough understanding of the present disclosure. However, it will be apparent to one of ordinary skill in the art that the present disclosure may be practiced without these specific details. In other instances, well-known methods, procedures, systems, and components have not been described in detail so as not to unnecessarily obscure aspects of the various embodiments.

Figure 1:
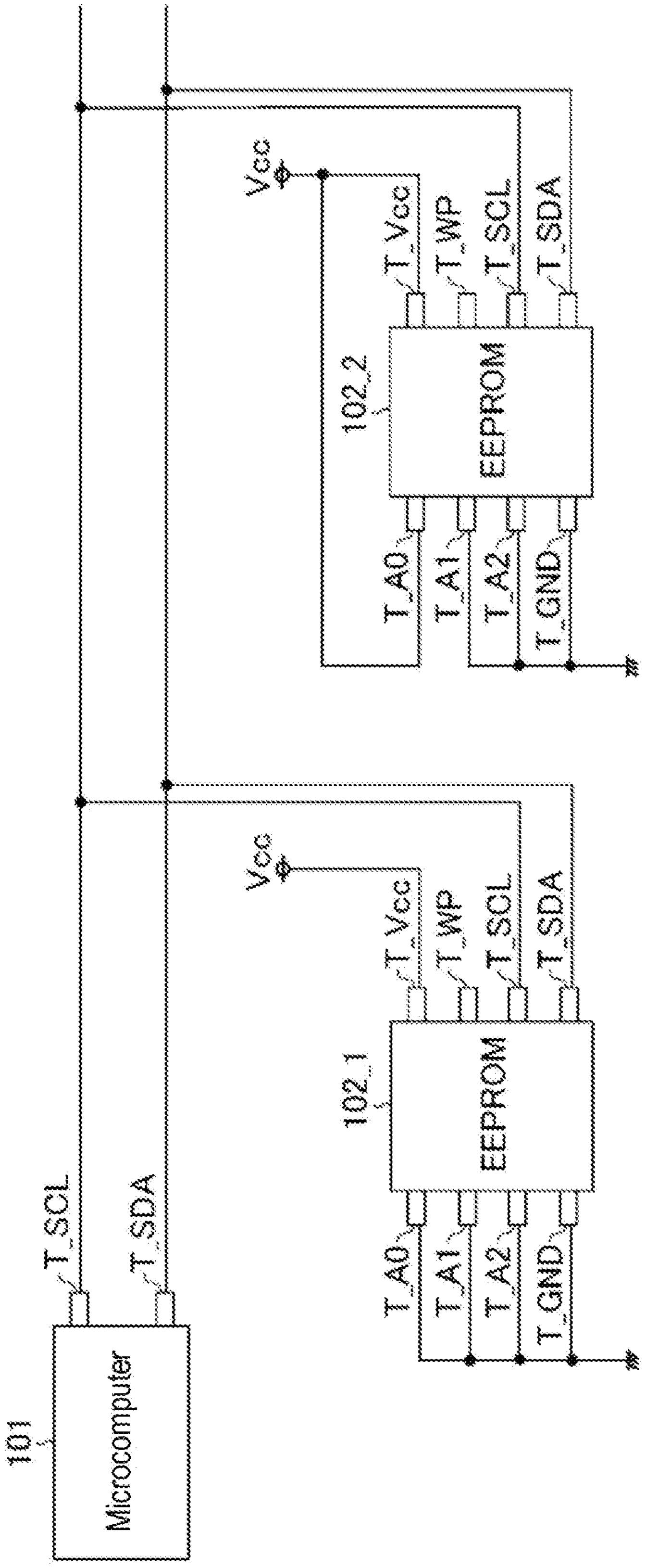
FIG. 1 (Related Art)
FIG. 1 is a diagram showing a configuration example of a conventional memory system.
Figure 2:
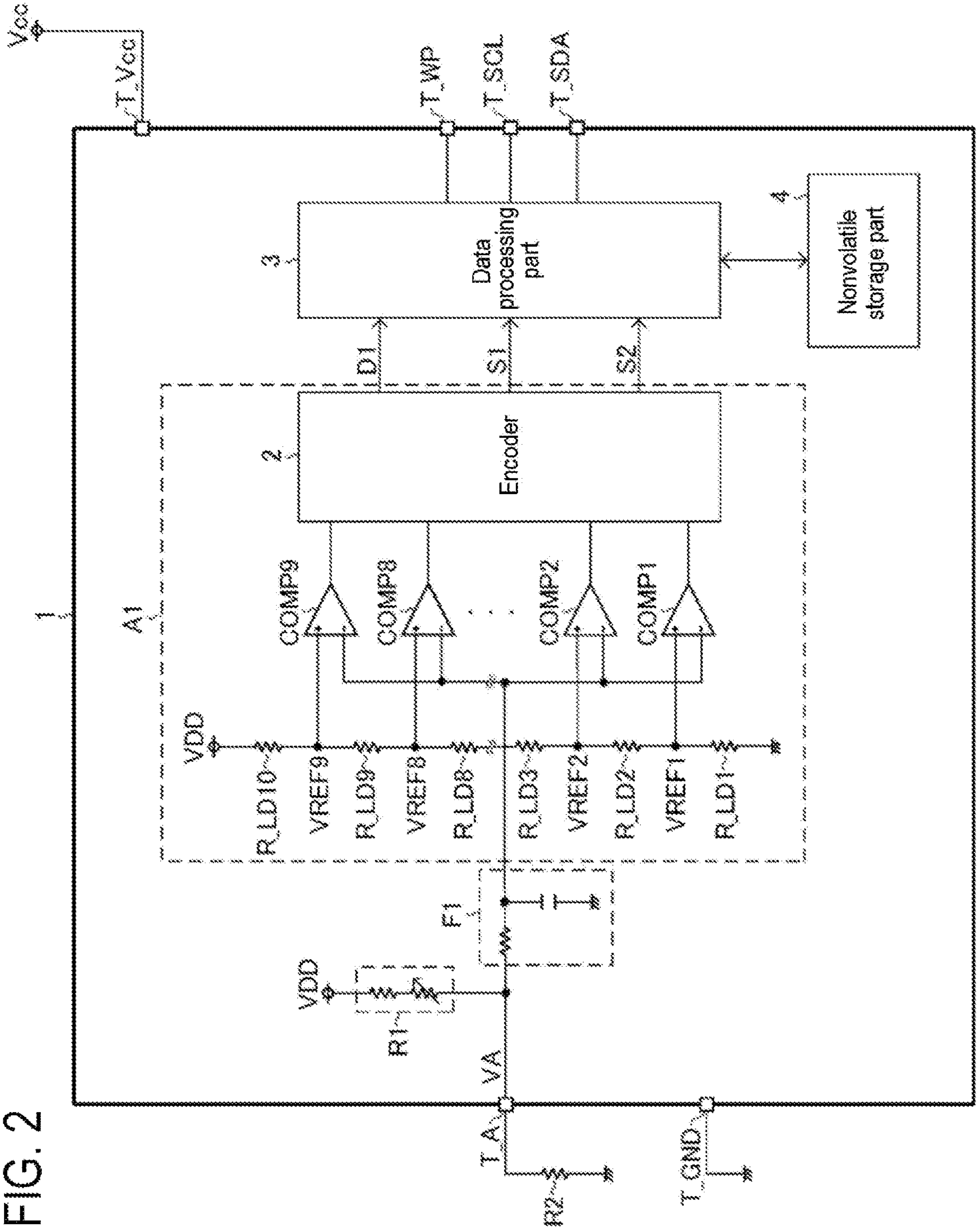
FIG. 2 is a diagram showing a configuration of an EEPROM according to an embodiment.
Figure 3:
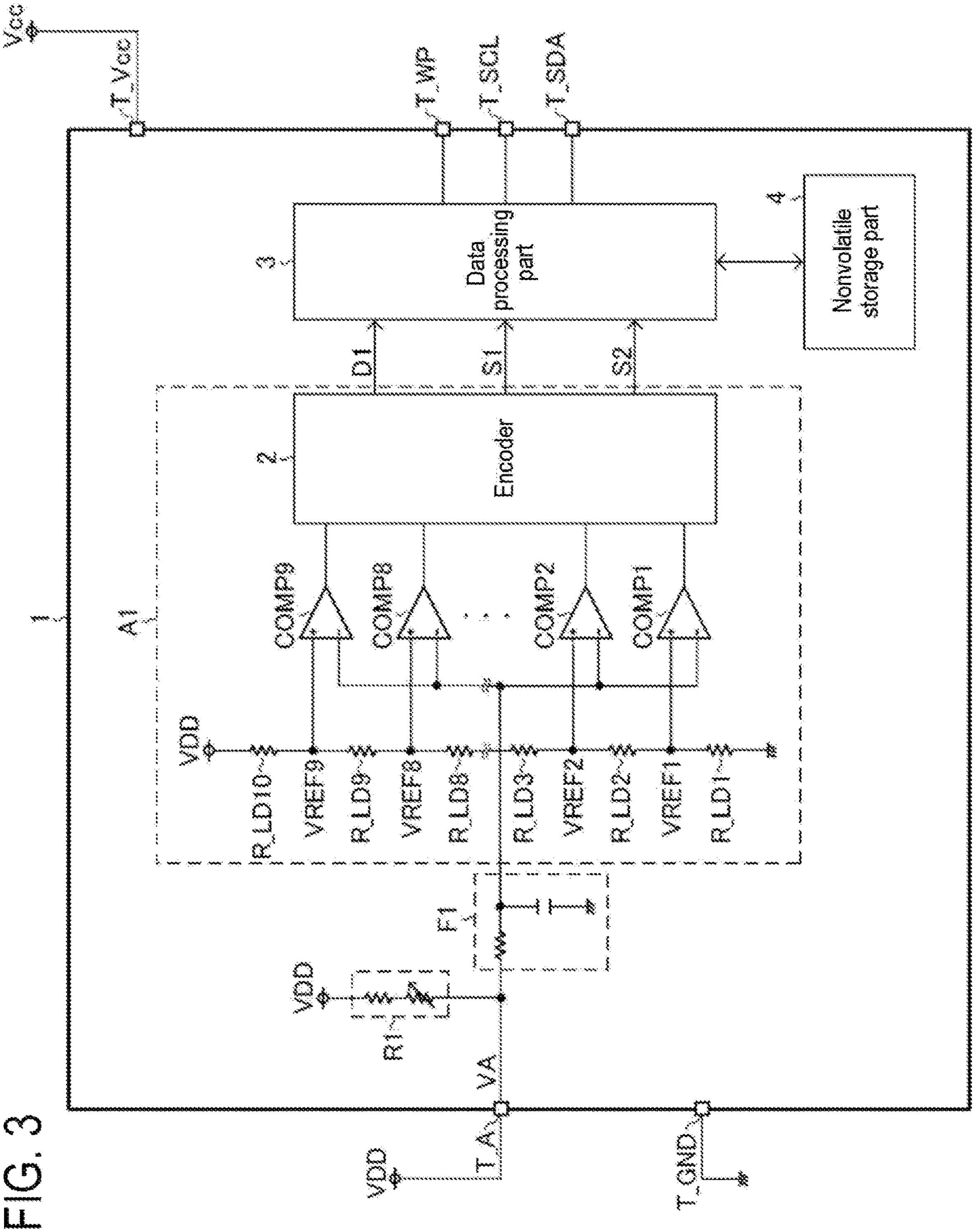
FIG. 3 is a diagram showing a configuration of the EEPROM according to an embodiment.
Figure 4:
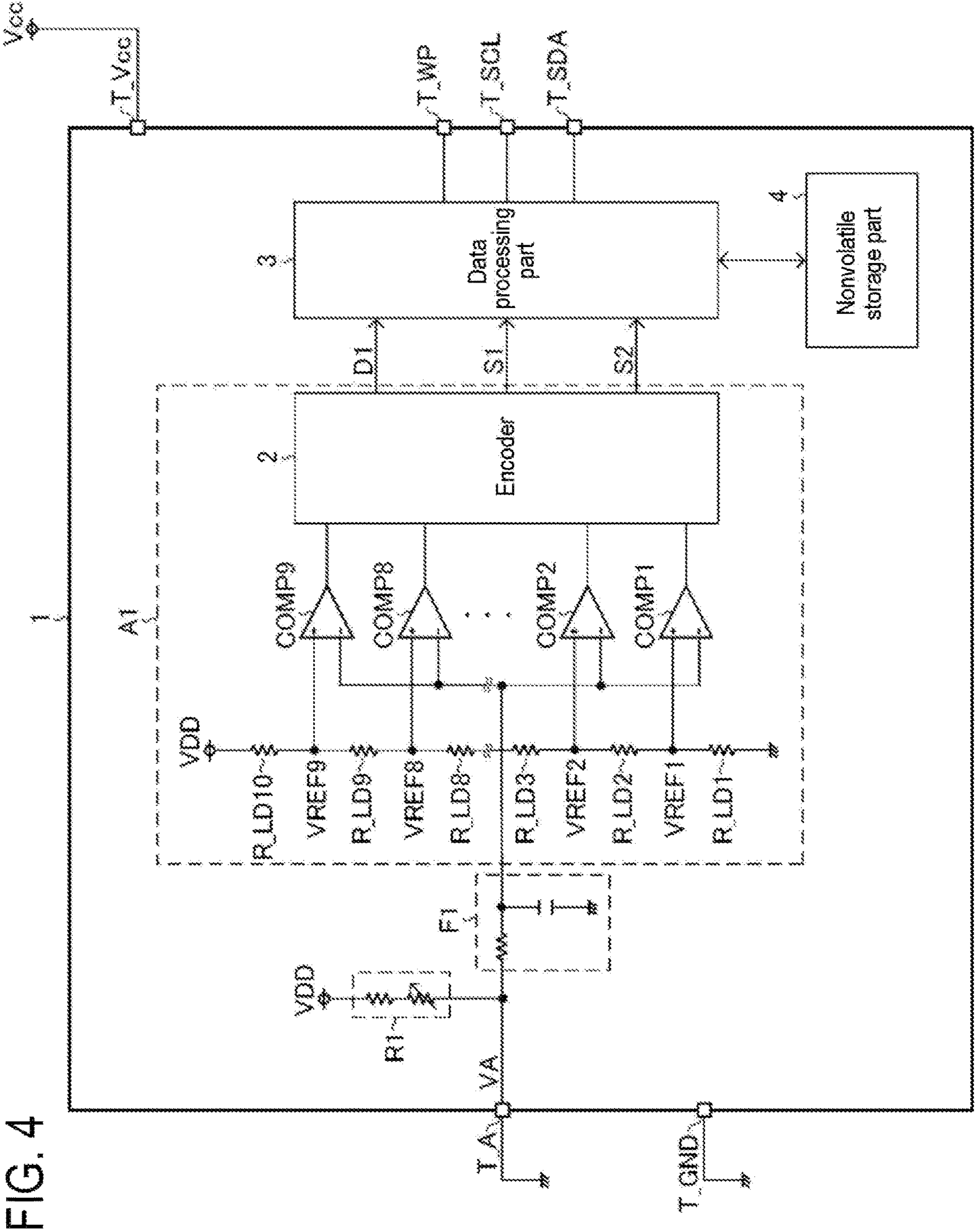
FIG. 4 is a diagram showing a configuration of the EEPROM according to an embodiment.

FIGS. 2 to 4 are diagrams showing a configuration of an EEPROM according to an embodiment. FIG. 2 is a diagram showing a state in which a pull-down resistor R2 is externally connected to an address terminal T_A of the EEPROM 1. FIG. 3 is a diagram showing a state in which a predetermined voltage VDD is applied to the address terminal T_A of the EEPROM 1. FIG. 4 is a diagram showing a state in which a ground voltage is applied to the address terminal T_A of the EEPROM 1.

The EEPROM 1 is an example of a semiconductor integrated circuit device. The semiconductor integrated circuit device is an electronic component formed by enclosing a semiconductor integrated circuit in a housing (package) made of resin. A plurality of terminals are provided to be exposed in the housing of the semiconductor integrated circuit device.

The EEPROM 1 includes a pull-up resistor R1, a filter circuit F1, an AD converter A1, a data processing part 3, a nonvolatile storage part 4, an address terminal T_A, terminals T_SCL and T_SDA for I2C communication, and terminals T_Vcc, T_GND, and T_WP.

A first end of the pull-up resistor R1 is connected to the address terminal T_A. A divided voltage VDD of a power supply voltage Vcc is applied to a second end of the pull-up resistor R1. In FIG. 2, a first end of the pull-down resistor R2 is connected to the address terminal T_A, and a ground voltage is applied to a second end of the pull-down resistor R2.

The AD converter A1 converts a voltage VA of the address terminal T_A into 3-bit digital data D1.

The data processing part 3 recognizes an address of the EEPROM 1 based on the digital data D1. The data processing part 3 communicates with an external device such as a microcomputer, and writes/reads data to/from the nonvolatile storage part 4.

The nonvolatile storage part 4 includes a plurality of memory cells (transistor cells) and stores data in a nonvolatile manner.

The filter circuit F1 is provided between the address terminal T_A and the AD converter A1. The filter circuit F1 is a low-pass filter including a resistor and a capacitor. By providing the filter circuit F1, it is possible to prevent an address from being erroneously recognized due to high-frequency noise flowing into the address terminal T_A.

The EEPROM 1 may set an address in one address terminal T_A. Accordingly, for example, when the EEPROM 1 is mounted on a DRAM module, the number of terminals of the DRAM module to which functions other than those related to the EEPROM can be assigned can be increased. Further, since the EEPROM 1 has one address terminal T_A, it can be enclosed by a package with a small number of terminals, thereby reducing the mounting area of a board on which internal components are mounted.

In this embodiment, the AD converter A1 is a flash type AD converter. The flash type AD converter has advantages of easy logic control and less influence of noise and interference. Further, unlike this embodiment, the AD converter A1 may have a configuration other than a flash type.

The AD converter A1, which is a flash type AD converter, includes comparators COMP1 to COMP9, a resistor ladder circuit including resistors R_LD1 to R_LD10, and an encoder 2.

The divided voltage VDD of the power supply voltage Vcc is applied to a first end of the resistor ladder circuit, and the ground voltage is applied to a second end of the resistor ladder circuit. The above-mentioned resistor ladder circuit generates a plurality of reference voltages VREF1 to VREF9 having different values at respective connection nodes between two resistors.

The divided voltage VDD of the power supply voltage Vcc applied to the first end of the pull-up resistor R1 and the divided voltage VDD of the power supply voltage Vcc applied to the first end of the resistor ladder circuit including the resistors R_LD1 to R_LD10 have the same voltage value. Therefore, for example, even if the power supply voltage Vcc fluctuates due to the influence of temperature, etc., the voltage VA of the address terminal T_A and the plurality of reference voltages VREF1 to VREF9 are similarly affected by the voltage fluctuation. As a result, the AD converter A1 may read the resistor value of the pull-down resistor R2 with high precision. Accordingly, a highly precise constant voltage circuit or constant current circuit is not required, so that the AD converter A1 can be implemented as a simple circuit configuration.

Figure 5:
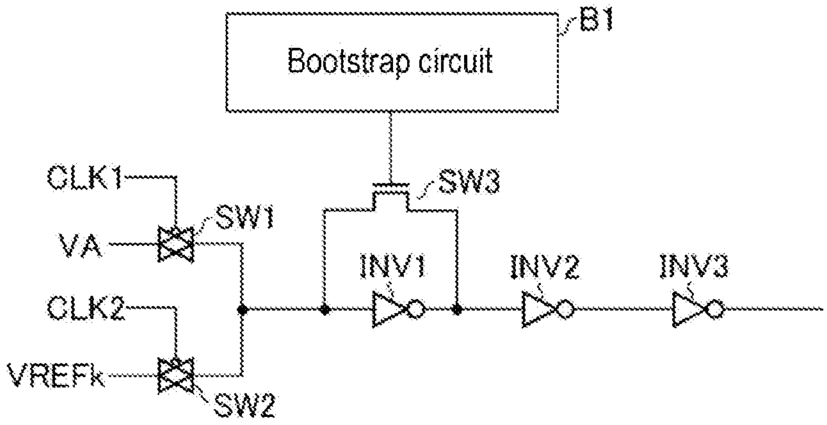
FIG. 5 is a diagram showing a configuration example of a comparator.

A comparator COMPk (k is any natural number from 1 to 9) compares the voltage VA of the address terminal T_A and a reference voltage VREFk. FIG. 5 is a diagram showing a configuration example of the comparator COMPk. The comparator COMPk in the configuration example shown in FIG. 5 is a chopper type comparator including switches SW1 to SW3 and inverters INV1 to INV3. The switch SW1 is controlled by a clock signal CLK1, and the switch SW2 is controlled by a clock signal CLK2. The clock signals CLK1 and CLK2 are adjusted so that the switches SW1 and SW2 are not turned on at the same time. The switch SW3 is an N-channel type MOS field effect transistor and is connected in parallel to the inverter INV1. The EEPROM 1 includes a bootstrap circuit B1 that supplies a gate signal to the switch SW3. The bootstrap circuit B1 receives, for example, the divided voltage VDD of the power supply voltage Vcc and uses a boot voltage, which is obtained by boosting the divided voltage VDD of the power supply voltage Vcc, as a HIGH level of the gate signal. By supplying the gate signal from the bootstrap circuit B1 to the switch SW3, the on-resistance of the switch SW3 can be reduced.

The encoder 2 converts each output of the comparators COMP1 to COMP9 into the 3-bit digital data D1. FIG. 6 is a diagram showing a relationship between the resistance value of the pull-down resistor R2 and the 3-bit digital data D1 (address). As can be seen from the relationship in FIG. 6, the address of the EEPROM 1 can be set by the resistance value of the pull-down resistor R2.

Figure 7:
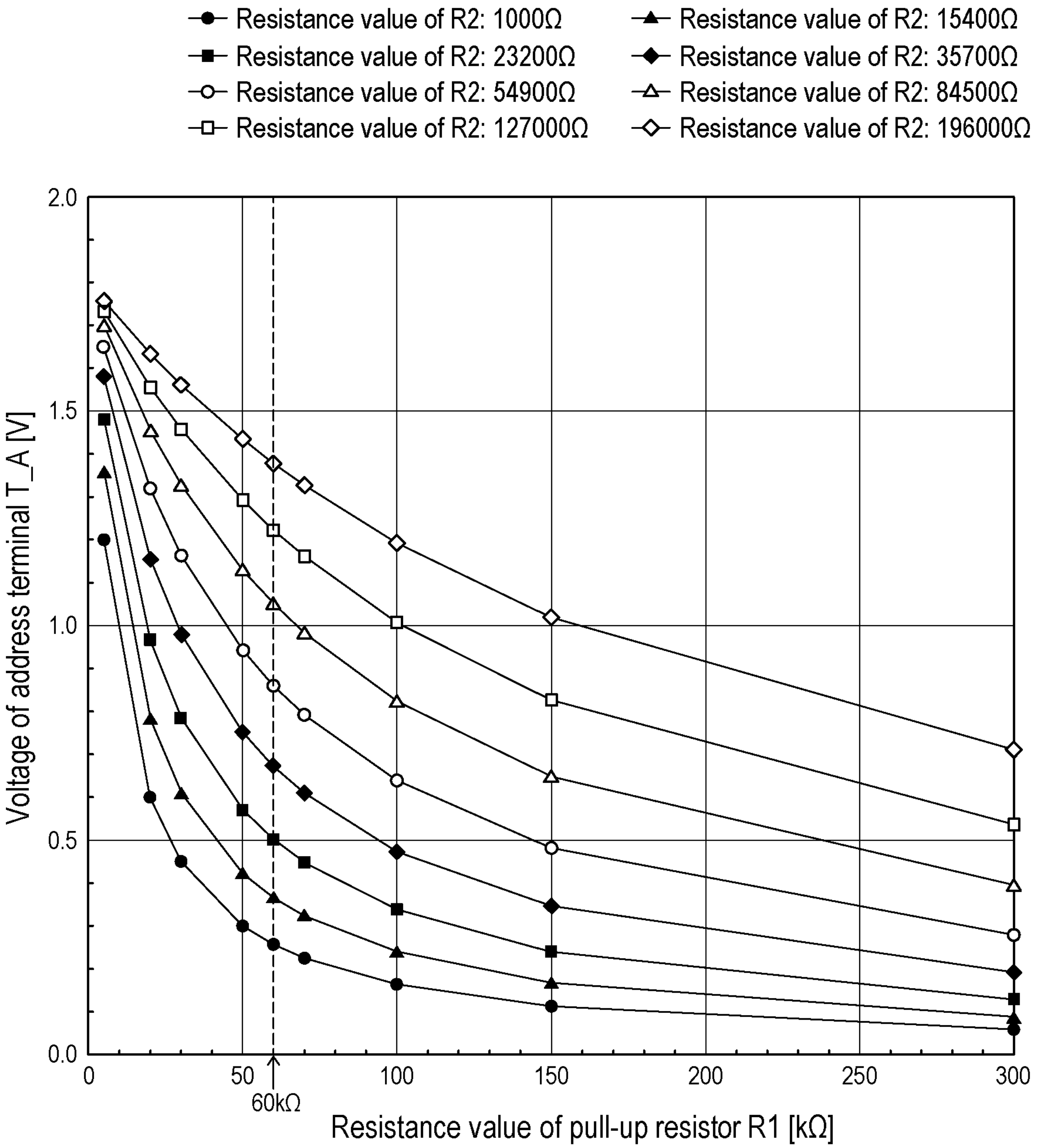
FIG. 7 is a diagram showing a relationship between a resistance value of a pull-up resistor and a voltage of an address terminal when the resistance value of the pull-down resistor is set to each of eight types shown in FIG. 6.

FIG. 7 is a diagram showing a relationship between the resistance value of the pull-up resistor R1 and the voltage VA of the address terminal T_A when the resistance value of the pull-down resistor R2 is set to each of eight types shown in FIG. 6. As can be seen from the relationship in FIG. 7, when the resistance value of the pull-up resistor R1 is set to 60 kΩ, the amount of change in the voltage VA of the address terminal T_A when the setting of the resistance value of the pull-down resistor R2 is sequentially switched becomes equal, thereby making it difficult for an address to be erroneously recognized. Therefore, in this embodiment, the resistance value of the pull-up resistor R1 is set to 60 kΩ.

The pull-up resistor R1 includes a trimmable configuration so that component variations in the pull-down resistor R2 or manufacturing process variations in the pull-up resistor R1 can be corrected.

Figure 8:
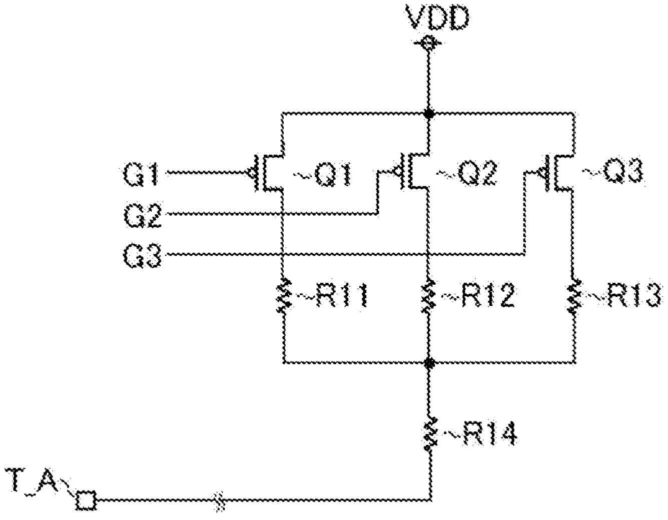
FIG. 8 is a diagram showing a configuration example of the pull-up resistor.

FIG. 8 is a diagram showing a configuration example of the pull-up resistor R1. The pull-up resistor R1 includes resistors R11 to R14 and P-channel type MOS (Metal Oxide Semiconductor) field effect transistors Q1 to Q3. A parallel circuit is constituted by connecting, in parallel, a series circuit with the resistor R11 and the MOS field effect transistor Q1, a series circuit with the resistor R12 and the MOS field effect transistor Q2, and a series circuit with the resistor R13 and the MOS field effect transistor Q3. The parallel circuit is then connected in series to the resistor R14.

The nonvolatile storage part 4 stores trimming setting for the pull-up resistor R1. Specifically, the nonvolatile storage part 4 stores the level of each of gate signals of the MOS field effect transistors Q1 to Q3. The data processing part 3 controls the MOS field effect transistors Q1 to Q3 based on the trimming setting of the pull-up resistor R1 stored in the nonvolatile storage part 4.

Figure 9:
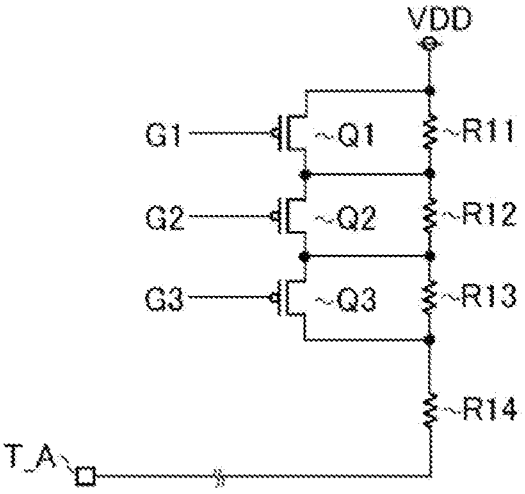
FIG. 9 is a diagram showing another configuration example of the pull-up resistor.

For example, the pull-up resistor R1 may include a configuration as shown in FIG. 9, but in the case of the configuration shown in FIG. 9, when a plurality of MOS field effect transistors are turned on, an influence of the on-resistance of the plurality of MOS field effect transistors on the resistance value of the pull-up resistor R1 increases. Therefore, it is desirable for the pull-up resistor R1 to have the configuration as shown in FIG. 8.

As shown in FIG. 3, when the predetermined voltage VDD is applied to the address terminal T_A, the encoder 2 outputs a signal S1 corresponding to the predetermined voltage VDD. This facilitates a production test of the EEPROM 1. As shown in FIG. 3, when the predetermined voltage VDD is applied to the address terminal T_A, each of outputs of the comparators COMP1 to COMP9 becomes a LOW level. The encoder 2 outputs the signal S1 when each of the outputs of the comparators COMP1 to COMP9 is at the LOW level. The signal S1 is, for example, an analog voltage signal with the same voltage value as the power supply voltage Vcc.

As shown in FIG. 4, when the ground voltage is applied to the address terminal T_A, the encoder 2 outputs a signal S2 corresponding to the ground voltage. This facilitates the production test of the EEPROM 1. As shown in FIG. 4, when the ground voltage is applied to the address terminal T_A, each of the outputs of the comparators COMP1 to COMP9 becomes a HIGH level. The encoder 2 outputs the signal S2 when each of the outputs of the comparators COMP1 to COMP9 is at the HIGH level. The signal S2 is, for example, an analog voltage signal with the same voltage value as the ground voltage.

Figure 10:
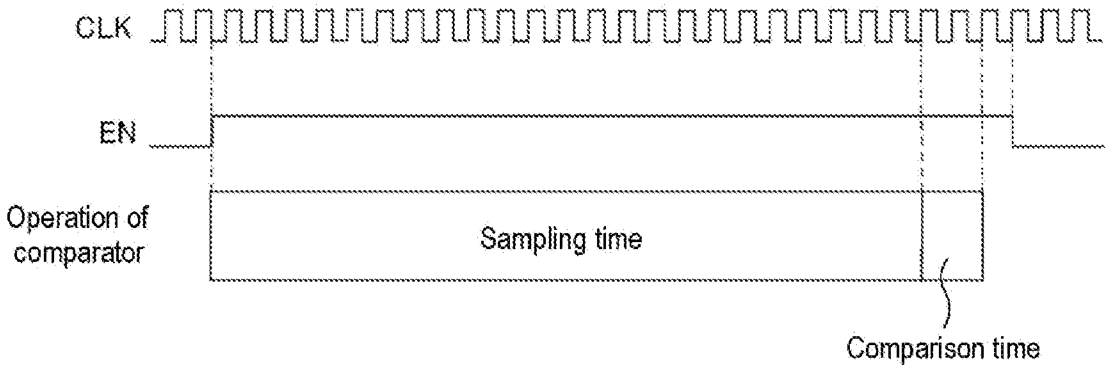
FIG. 10 is a diagram showing a startup sequence of the EEPROM according to the embodiment.

FIG. 10 is a diagram showing a startup sequence of the EEPROM 1. When the supply of the power supply voltage Vcc to the terminal T_Vcc is started, the EEPROM 1 shifts from a power-off state to a power-on state and generates a clock signal CLK using an internal oscillator. The EEPROM 1 operates based on the clock signal CLK.

After shifting from the power-off state to the power-on state, the EEPROM 1 first sets an enable signal EN as a HIGH level. An enable/disable changeover switch is provided between the pull-up resistor R1 and an application terminal to which the divided voltage VDD of the power supply voltage Vcc is applied, between the address terminal T_A and an application terminal to which the ground potential is applied, and between the resistor R_LD10 and an application terminal to which the divided voltage VDD of the power supply voltage Vcc is applied. The enable/disable changeover switch is turned on when the enable signal EN is at a HIGH level, and turned off when the enable signal EN is at a LOW level.

When the enable signal EN becomes the HIGH level, the comparators COMP1 to COMP9 sample the voltage VA of the address terminal T_A. After that, the comparator COMPk compares the voltage VA of the address terminal T_A and the reference voltage VREFk. After the comparison operation of the comparator COMPk is completed, the enable signal EN switches from the HIGH level to a LOW level.

Others

The embodiments of the present disclosure may be appropriately modified in various ways within the scope of the technical ideas shown in the claims. The various embodiments described so far may be appropriately combined and implemented unless contradictory. The above embodiments are merely examples of the embodiments of the present disclosure, and the meanings of the terms of the present disclosure or each component are not limited to those described in the above embodiments.

Figure 11:
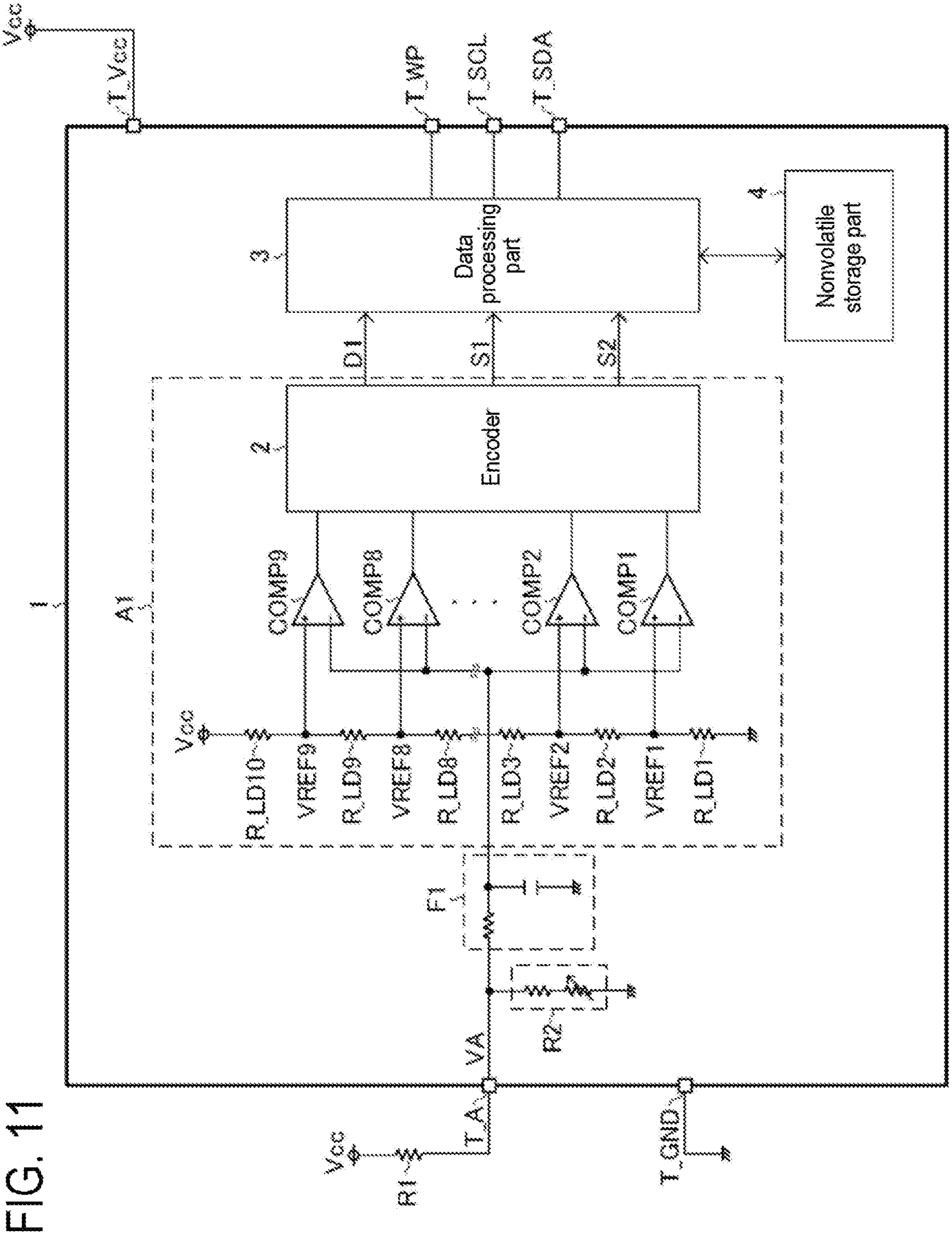
FIG. 11 is a diagram showing a modification of the EEPROM according to the embodiment.

In the above-described embodiments, the EEPROM 1 includes a configuration in which the pull-up resistor R1 is an internal resistor and the pull-down resistor R2 is connected externally, but as shown in FIG. 11, the EEPROM 1 may include a configuration in which the pull-down resistor R2 is an internal resistor and the pull-up resistor R1 is connected externally. In the configuration shown in FIG. 11, it is desirable that the pull-down resistor R2 is trimmable and the trimming setting is stored in the nonvolatile storage part 4. Further, it is desirable that a voltage applied to the first end of the pull-up resistor R1 has the same voltage value as a voltage applied to the first end of the resistor ladder circuit including the resistors R_LD1 to R_LD10.

In the above-described embodiments, the AD converter A1 is a 3-bit AD converter, but it is not limited to 3 bits, and may be any multiple-bit AD converter. That is, the number of bits of the digital data D1 output from the AD converter A1 is not limited to 3 bits, but may be any plural number of bits.

In the above-described embodiments, the EEPROM has been described as an example, but the semiconductor integrated circuit device may be other than the EEPROM.

Supplementary Notes

Supplementary Notes are provided for the present disclosure in which specific configuration examples are shown in the above-described embodiments.

A semiconductor integrated circuit device (1) according to the present disclosure has a configuration (first configuration) that includes: a terminal (T_A); an internal resistor that is either a pull-up resistor (R1) including a first end which is connected to the terminal and a second end to which a first constant voltage is applied or a pull-down resistor (R2) including a first end which is connected to the terminal and a second end to which a ground voltage is applied; and an AD converter (COMP1 to COMP9, R_LD1 to R_LD10, 2) configured so that a voltage of the terminal is converted into digital data with a number of bits of 2 or more.

The semiconductor integrated circuit device of the first configuration may have a configuration (second configuration) that the internal resistor is configured to be trimmable, and the device further includes a nonvolatile storage part (4) configured to store trimming setting.

The semiconductor integrated circuit device of the first or second configuration may have a configuration (third configuration) that the AD converter includes: a resistor ladder circuit (COMP1 to COMP9) configured to generate a plurality of reference voltages; a plurality of comparators (R_LD1 to R_LD10) configured to compare the voltage of the terminal and each of the plurality of reference voltages; and an encoder (2) configured to convert each of outputs of the plurality of comparators into the digital data.

The semiconductor integrated circuit device of the third configuration may have a configuration (fourth configuration) that the internal resistor is the pull-up resistor, and the first constant voltage and a second constant voltage applied to a first end of the resistor ladder circuit have the same voltage value.

The semiconductor integrated circuit device of the third configuration may have a configuration (fifth configuration) that the internal resistor is the pull-down resistor, the pull-up resistor is externally connected to the terminal, and the first constant voltage and a second constant voltage applied to a first end of the resistor ladder circuit have the same voltage value.

The semiconductor integrated circuit device of any one of the third to fifth configurations may have a configuration (sixth configuration) that if a predetermined voltage is applied to the terminal, the encoder is configured to output a signal corresponding to the predetermined voltage.

The semiconductor integrated circuit device of any one of the third to sixth configurations may have a configuration (seventh configuration) that when the ground voltage is applied to the terminal, the encoder is configured to output a signal corresponding to the ground voltage.

The semiconductor integrated circuit device of any one of the third to seventh configurations may have a configuration (eighth configuration) that each of the plurality of comparators is a chopper type comparator, and the device further includes: a bootstrap circuit (B1) configured to supply a boot voltage to a gate of a switch (SW3) which is an NMOS transistor provided in the chopper type comparator.

The semiconductor integrated circuit device of any one of the third to eighth configurations may have a configuration (ninth configuration) that the device further includes a filter circuit (F1) provided between the terminal and the AD converter.

While certain embodiments have been described, these embodiments have been presented by way of example only, and are not intended to limit the scope of the disclosures. Indeed, the embodiments described herein may be embodied in a variety of other forms. Furthermore, various omissions, substitutions and changes in the form of the embodiments described herein may be made without departing from the spirit of the disclosures. The accompanying claims and their equivalents are intended to cover such forms or modifications as would fall within the scope and spirit of the disclosures.

What is claimed is:

1. A semiconductor integrated circuit device comprising:

a terminal;

an internal resistor that is either a pull-up resistor including a first end which is connected to the terminal and a second end to which a first constant voltage is applied or a pull-down resistor including a first end which is connected to the terminal and a second end to which a ground voltage is applied;

an analog-to-digital (AD) converter configured so that a voltage of the terminal is converted into digital data having a number of bits of 2 or more; and a data processor configured to determine, based on the digital data, a device address of the semiconductor integrated circuit device, wherein the semiconductor integrated circuit device is configured to perform communication with an external device using the device address.

2. The semiconductor integrated circuit device of claim 1, wherein the internal resistor is configured to be trimmable, and wherein the semiconductor integrated circuit device further comprises:

a nonvolatile storage part configured to store a trimming setting.

3. The semiconductor integrated circuit device of claim 1, wherein the AD converter includes:

a resistor ladder circuit configured to generate a plurality of reference voltages;

a plurality of comparators configured to compare the voltage of the terminal and each of the plurality of reference voltages; and an encoder configured to convert each of outputs of the plurality of comparators into the digital data.

4. The semiconductor integrated circuit device of claim 3, wherein the internal resistor is the pull-up resistor, and wherein the first constant voltage and a second constant voltage applied to a first end of the resistor ladder circuit have the same voltage value.

5. The semiconductor integrated circuit device of claim 3, wherein the internal resistor is the pull-down resistor, wherein the pull-up resistor is externally connected to the terminal, and wherein the first constant voltage and a second constant voltage applied to a first end of the resistor ladder circuit have the same voltage value.

6. The semiconductor integrated circuit device of claim 3, wherein if a predetermined voltage is applied to the terminal, the encoder is configured to output a signal corresponding to the predetermined voltage.

7. The semiconductor integrated circuit device of claim 3, wherein if the ground voltage is applied to the terminal, the encoder is configured to output a signal corresponding to the ground voltage.

8. The semiconductor integrated circuit device of claim 3, wherein each of the plurality of comparators is a chopper type comparator, and the semiconductor integrated circuit device further comprises:

a bootstrap circuit configured to supply a boot voltage to a gate of a switch which is an NMOS transistor provided in the chopper type comparator.

9. The semiconductor integrated circuit device of claim 3, further comprising:

a filter circuit provided between the terminal and the AD converter.

10. A semiconductor integrated circuit device comprising:

a terminal;

an internal resistor which is configured to be trimmable, and which is either a pull-up resistor including a first end which is connected to the terminal and a second end to which a first constant voltage is applied or a pull-down resistor including a first end which is connected to the terminal and a second end to which a ground voltage is applied;

an AD converter configured so that a voltage of the terminal is converted into digital data having a number of bits of 2 or more; and a nonvolatile storage part configured to store a trimming setting.

11. A semiconductor integrated circuit device comprising:

a terminal;

an internal resistor that is either a pull-up resistor including a first end which is connected to the terminal and a second end to which a first constant voltage is applied or a pull-down resistor including a first end which is connected to the terminal and a second end to which a ground voltage is applied;

an AD converter that is configured so that a voltage of the terminal is converted into digital data having a number of bits of 2 or more, and includes:

a resistor ladder circuit configured to generate a plurality of reference voltages;

a plurality of chopper type comparators configured to compare the voltage of the terminal and each of the plurality of reference voltages; and an encoder configured to convert each of outputs of the plurality of chopper type comparators into the digital data; and a bootstrap circuit configured to supply a boot voltage to a gate of a switch which is an NMOS transistor provided in each of the plurality of chopper type comparators.

* * * * *